US009324387B2

(12) United States Patent
Kim

(10) Patent No.: US 9,324,387 B2
(45) Date of Patent: Apr. 26, 2016

(54) SEMICONDUCTOR MEMORY DEVICE WITH DATA PATH OPTION FUNCTION

(71) Applicant: SAMSUNG ELECTRONICS CO., LTD.

(72) Inventor: Jinhyun Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 161 days.

(21) Appl. No.: 14/038,715

(22) Filed: Sep. 26, 2013

(65) Prior Publication Data

US 2014/0098599 A1 Apr. 10, 2014

(30) Foreign Application Priority Data

Oct. 4, 2012 (KR) ........................ 10-2012-0110126

(51) Int. Cl.

| | |
|---|---|
| ***G11C 13/00*** | (2006.01) |
| ***G11C 7/00*** | (2006.01) |
| ***G11C 7/10*** | (2006.01) |
| ***G11C 7/06*** | (2006.01) |
| ***G11C 11/16*** | (2006.01) |
| ***G11C 8/16*** | (2006.01) |

(52) U.S. Cl.

CPC .................. *G11C 7/106* (2013.01); *G11C 7/06* (2013.01); *G11C 7/1075* (2013.01); *G11C 8/16* (2013.01); *G11C 11/16* (2013.01); *G11C 11/1659* (2013.01); *G11C 11/1673* (2013.01); *G11C 11/1675* (2013.01); *G11C 13/0002* (2013.01); *G11C 13/003* (2013.01); *G11C 13/004* (2013.01); *G11C 13/0069* (2013.01)

(58) Field of Classification Search

CPC ........ G11C 7/106; G11C 8/16; G11C 7/1075; G11C 11/1659; G11C 13/003; G11C 11/1673; G11C 13/0002; G11C 11/1675; G11C 11/16; G11C 13/004; G11C 13/0069; G11C 7/06

USPC .................. 365/189.05, 206, 189.15, 189.16, 365/189.17, 189.14, 207, 208

See application file for complete search history.

(56) References Cited

U.S. PATENT DOCUMENTS

| | | | | |
|---|---|---|---|---|
| 7,209,383 | B2 | 4/2007 | Dray et al. | |
| 8,854,907 | B2 * | 10/2014 | Lym et al. | 365/201 |
| 2006/0152970 | A1 | 7/2006 | DeBrosse et al. | |
| 2008/0165592 | A1 | 7/2008 | Kitagawa et al. | |
| 2009/0021995 | A1 | 1/2009 | Oh | |
| 2009/0175086 | A1 | 7/2009 | Ryu | |
| 2009/0254698 | A1 * | 10/2009 | Kwon et al. | 711/105 |
| 2012/0044755 | A1 | 2/2012 | Kim et al. | |
| 2012/0057400 | A1 | 3/2012 | Kim et al. | |
| 2012/0069629 | A1 | 3/2012 | Ueda et al. | |

(Continued)

*Primary Examiner* — Richard Elms
*Assistant Examiner* — Jerome Leboeuf
(74) *Attorney, Agent, or Firm* — Muir Patent Law, PLLC

(57) ABSTRACT

A semiconductor memory device may include a memory cell, a bit line connected to the memory cell, a bit line data latch circuit configured to sense-amplify data stored in the memory cell connected to the bit line and to store write data in the memory cell via the bit line; an input/output driver configured to output read data on the bit line to an external device or to drive the write data provided from the external device; and a selection unit configured to select whether the read data and the write data are communicated between the input/output driver and the memory cell with or without use of the bit line data latch circuit.

14 Claims, 11 Drawing Sheets

(56) References Cited

U.S. PATENT DOCUMENTS

2013/0128658 A1* 5/2013 Alam et al. .................. 365/158
2013/0322164 A1* 12/2013 Lym et al. .................... 365/163
2014/0140124 A1* 5/2014 Kang et al. ................... 365/148

* cited by examiner

SEMICONDUCTOR MEMORY DEVICE WITH DATA PATH OPTION FUNCTION

CROSS-REFERENCE TO RELATED APPLICATIONS

This application claims priority under 35 U.S.C. §119 to Korean Patent Application No. 10-2012-0110126 filed Oct. 4, 2012, in the Korean Intellectual Property Office, the entire contents of which are hereby incorporated by reference.

BACKGROUND

The disclosure relates to a semiconductor memory device, and more particularly, to a semiconductor memory device with a data path option function.

A volatile semiconductor memory device such as a dynamic random access memory ("DRAM") may be used as a main memory of an electronic device (e.g., mobile device or computer).

A memory system may comprise the volatile semiconductor memory device and a memory control device. The memory system may be embedded in or connected with a host device such as a microprocessor.

The memory system may use a nonvolatile semiconductor memory device such as a flash memory to back up data of a main memory or to store program data.

A time taken from a point of time when a command is applied to a semiconductor memory device until read data is available to be fetched (e.g., on the output terminals of the memory device) is a particular type of latency of the memory system or memory device.

A random data read operation with short latency is often desirable with a random access read operation.

SUMMARY

One aspect of the disclosed embodiments is directed to a semiconductor memory device comprising a memory cell; a bit line connected to the memory cell; a bit line data latch configured to sense-amplify read data stored in the memory cell connected with the bit line and to store write data to be written in the memory cell through the bit line; an input/output driver configured to output the read data on the bit line to an external device and to drive the write data provided from the external device to the bit line; and a selection circuit configured to select whether the bit line data latch is bypassed or is used or bypassed to sense-amplify read data stored in the memory cell and to store the write data to be written in the memory cell.

In example embodiments, the selection circuit may select whether data stored in the memory cell is transferred directly to the input/output driver or to the input/output driver through use of the bit line data latch unit during a read operation, and selects whether the write data is transferred directly to the memory cell or to the memory cell via the bit line data latch unit during a write operation.

In example embodiments, the memory cell is a magneto-resistive random access memory type of memory cell.

In example embodiments, the magneto-resistive random access memory type of memory cell is a spin transfer torque magneto-resistive random access memory (STT-MRAM) cell.

In example embodiments, the bit line data latch unit comprises a bit line sense amplifier configured to compare a signal level of the bit line and a reference level of a source line to amplify a comparison result; and a bit line driver configured to generate a set bias voltage or a reset bias voltage in response to the write data.

In example embodiments, the input/output driver comprises an input/output sense amplifier configured to sense-amplify the read data on an input/output line; and a write driver configured to drive the input/output line with the write data.

In example embodiments, the selection circuit is a multiplexer configured to decide whether the input/output driver is connected to the memory cell or the bit line data latch unit is connected to the memory cell, in response to a mode register set signal.

In example embodiments, the multiplexer includes a plurality of MOS transistors gates of which are responsive to the mode register set signal.

In example embodiments, an active command and a read command are applied to the semiconductor memory device at a period of time corresponding to one clock cycle.

Embodiments disclosed herein provide a data processing system comprising a processor unit configured to execute data processing; and a semiconductor memory device connected to the processor including a memory cell; a bit line connected to the memory cell; a bit line data amplifier configured to sense-amplify data stored in the memory cell connected to the bit line and to store write data in the memory cell through the bit line; an input/output driver configured to output read data on the bit line to the bus or to drive write data provided from the bus; and a selection circuit configured to select whether the read data and the write data are communicated between the memory cell and the input/output driver using the bit line data amplifier. The bit line data amplifier may comprise a bit line data latch.

In example embodiments, the selection circuit makes the write data be transferred to the memory cell via the bit line data latch amplifier during a write operation and makes data stored in the memory cell be transferred directly to the input/output driver without passing using the bit line data latch amplifier during a read operation.

In example embodiments, the processor unit applies an active command and a read command to the semiconductor memory device at a period of time corresponding to one clock cycle at the read operation.

In example embodiments, the selection circuit makes the write data be transferred directly to the memory cell without passing through the bit line data latch unit during a write operation and makes data stored at the memory cell be transferred directly to the input/output driver without passing through the bit line data latch unit during a read operation.

In example embodiments, the processor unit applies an active command and a write command to the semiconductor memory device during a period of time corresponding to one clock cycle at the read operation.

In example embodiments, the processor unit includes a plurality of processors and the semiconductor memory device is a multi-port MRAM.

In example embodiments, a memory device may comprise a memory cell; a bit line connected to the memory cell; a bit line data amplifier; an input/output driver; and a selection circuit, the selection circuit being operable in a first mode to configure a first data path between the input/output driver and the memory cell and in a second mode to configure a second data path between the input/output driver and the memory cell, wherein in the first mode the bit line data amplifier is configured to amplify data transmitted between the input/output driver and the memory cell and in the second mode the bit line data amplifier is not configured to amplify data transmitted between the input/output driver and the memory cell.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
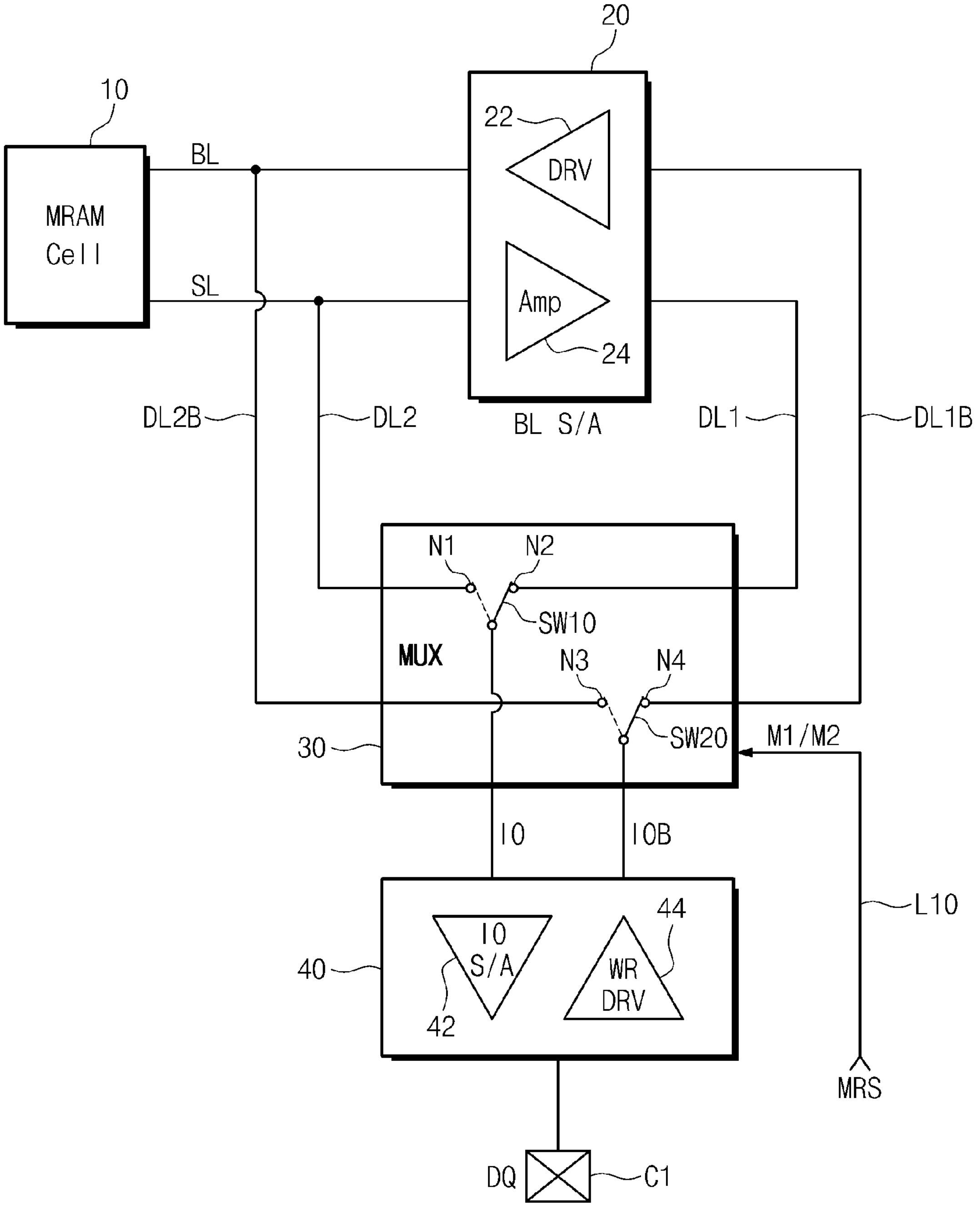
FIG. 1 is a block diagram schematically illustrating a semiconductor memory device according to an embodiment.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments. Note that details of data access operations and internal function circuits associated with a NAND flash memory, a DRAM, and an MRAM may be the same as or similar to conventional memories and thus description of such details may not be set forth herein.

FIG. 1 is a block diagram schematically illustrating a semiconductor memory device according to an embodiment of the inventive concept.

Referring to FIG. 1, a semiconductor memory device may include a memory cell 10, a bit line data latch unit 20, a selection unit 30, and an input/output driver 40.

The bit line data latch unit 20 may sense-amplify data stored at the memory cell 10 connected with a bit line BL or store write data at the memory cell 10 through the bit line BL.

In the event that the memory cell 10 is an MRAM cell, the bit line data latch unit 20 may include a bit line sense amplifier 24, which compares a signal level of the bit line BL and a reference level of a source line SL to amplify a comparison result, and a bit line driver 22 which generates and applies to the bit line BL a set bias voltage or a reset bias voltage in response to the write data applied through a DQ pad C1 as received on data lines DL1 and DL1B via input/output driver 40.

The input/output driver 40 may receive read data of the bit line BL through input/output lines IO and IOB to output it to an external device. The input/output driver 40 may drive the input/output lines IO and IOB with the write data on DQ pad C1 applied from the external device. The input/output driver 40 may include an input/output sense amplifier 42, which senses and amplifies the read data of the input/output lines IO and IOB, and a write driver 44 which drives the input/output lines IO and IOB with the write data on DQ pad C1.

The selection unit 30 may select whether the read data and the write data are transferred via the bit line data latch unit 20 via data lines DL1 and DL1B or directly from the bit line BL and source line SL via data lines DL2 and DL2B (which may bypass the bit line data latch unit 20), in response to a selection control signal MRS applied through a line L10.

That is, at a read operation, the selection unit 30 may select whether data stored at the memory cell 10 is transferred directly to the input/output driver 40 or to the input/output driver 40 through the bit line data latch unit 20. For example, if first and second switches SW10 and SW20 in the selection unit 30 are switched into switching nodes N1 and N3, data line DL2 may be connected to the input/output line IO, and data line DL2B may be connected to the input/output line IOB. Thus, data stored at the memory cell 10 may be transferred directly to the input/output driver 40.

Alternatively, if the first and second switches SW10 and SW20 in the selection unit 30 are switched to switching nodes N2 and N4, a data line DL1 may be connected to the input/output line IO, and a data line DL1B may be connected to the input/output line IOB. Thus, data stored at the memory cell 10 may be transferred to the input/output driver 40 through the bit line data latch unit 20.

Also, at a write operation, the selection unit 30 may select whether write data is transferred directly to the memory cell 10 or to the memory cell 10 through the bit line data latch unit 20. For example, if the first and second switches SW10 and SW20 in the selection unit 30 are switched to the switching nodes N1 and N3, the data line DL2 may be connected to the input/output line IO, and the data line DL2B may be connected to the input/output line IOB. Thus, write data may be transferred directly to the memory cell 10 without use of bit line data latch unit 20.

Alternatively, if the first and second switches SW10 and SW20 in the selection unit 30 are switched into switching nodes N2 and N4, the data line DL1 may be connected to the input/output line IO, and the data line DL1B may be connected to the input/output line IOB. Thus, write data may be transferred to the memory cell 10 through the bit line data latch unit 20.

Under the control of the selection unit 30, the input/output driver 40 may be connected directly to the memory cell 10 or to the memory cell 10 through the bit line data latch unit 20. The selection unit 30 may be formed of a multiplexer. The selection unit switching unit 30 may be controlled by a mode signal M1/M2 provided on line L10 from a mode register set MRS.

A magneto-resistive random access type of memory cell may be a spin transfer torque magneto-resistive random access memory (STT-MRAM) cell.

If the memory cell 10 is an MRAM cell, the bit line data latch unit 20 may be different in configuration and function from a bit line sense amplifier of a DRAM. Also, the source line SL may be set to a predetermined reference level REF, rather than to a logic level opposite to a logic level of the bit line BL. Unlike a DRAM cell, the MRAM cell may be a nonvolatile memory cell which does not need a refresh operation. Thus, a write operation may need a set bias voltage for storing '0' data and a reset bias voltage for storing '1' data. As a result, the bit line data latch unit 20 may generate the set bias voltage in response to write data of '0' and the reset bias voltage in response to write data of '1'.

However, write data may be stored at the memory cell 10 through appropriate driving of the write driver 44 without driving of the bit line driver 22. In this case, since write data is not driven by the bit line driver 22, a write time of operation may be relatively longer. On the other hand, at a read operation, the latency may be bettered.

At a read operation, a sensing current may be applied to the bit line BL which is pre-charged with a constant voltage. Thus, when the sensing current is supplied, a storage element of the memory cell, that is, a magnetic tunnel junction (MTJ) may cause a voltage variation differently according to a direction of a magnetic field stored. Accordingly, a level of data stored at a memory cell may be read by sensing a voltage level of the bit line BL through a sense amplifier.

The above-described configuration and description may be exemplary. However, the inventive concept is not limited thereto.

Figure 2:
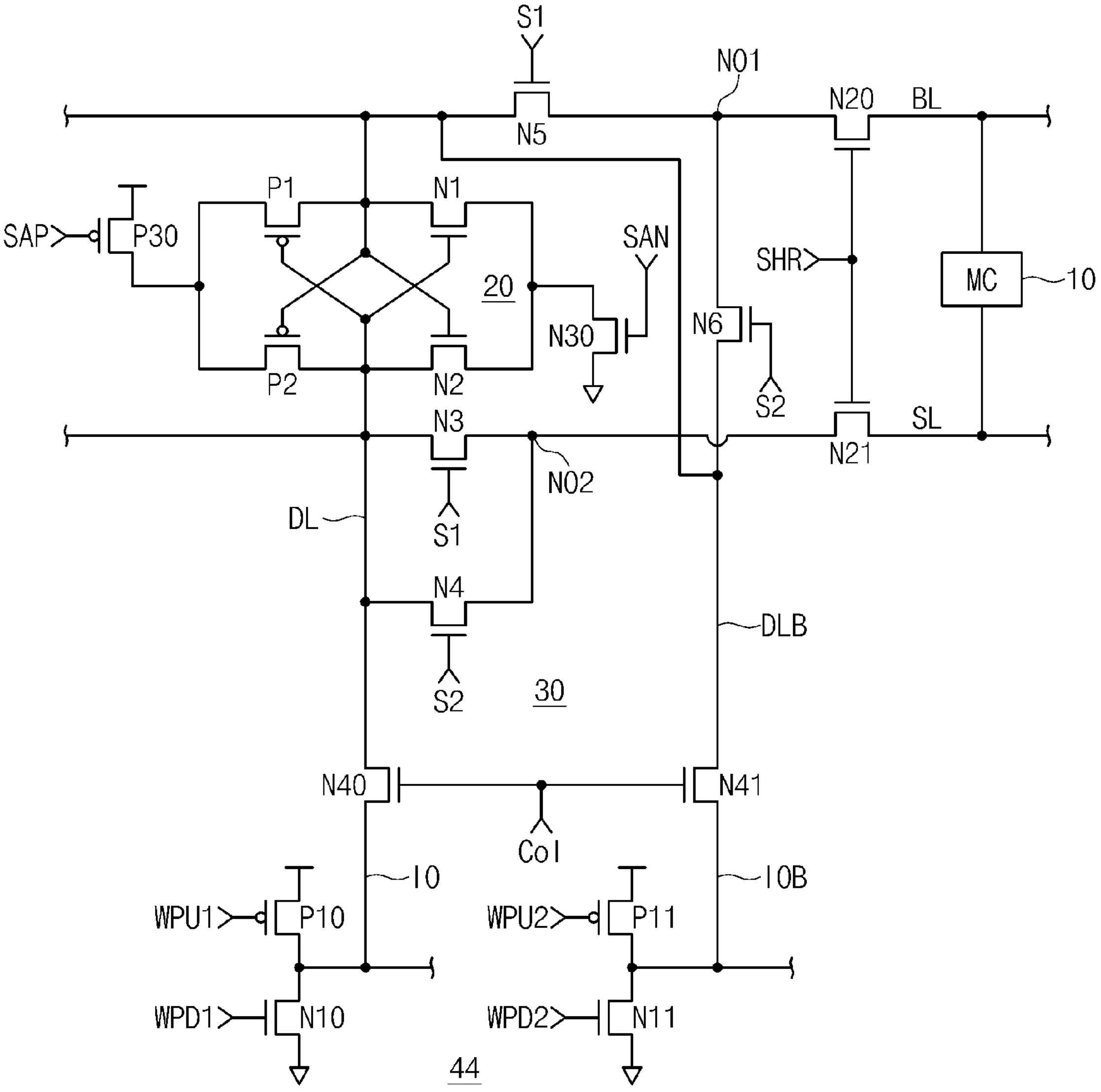
FIG. 2 is a circuit diagram illustrating an exemplary selection unit and an exemplary bit line data latch unit of a semiconductor device of FIG. 1.

FIG. 2 is a circuit diagram illustrating an exemplary selection unit and an exemplary bit line data latch unit of a semiconductor device of FIG. 1.

Referring to FIG. 2, a write driver 44 of an input/output driver 40 of FIG. 1 may include PMOS transistors P10 and P11 and NMOS transistors N10 and N11.

A memory cell 10 of FIG. 1 may be connected between a bit line BL and a source line SL.

A bit line data latch unit 20 may include PMOS transistors P1, P2, and P30 and NMOS transistors N1, N2, and N30.

A selection unit 30 may include NMOS transistors N3, N4, N5, and N6.

NMOS transistors N40 and N41 may constitute a column switch, and may operationally connect input/output lines IO and IOB with data lines DL and DLB in response to a column selection signal Col.

At a write operation, the transistors N3 and N5 may be turned off and the NMOS transistors N4 and N6 may be turned on, thus bypassing use of bit line data latch unit 20. In the example of FIG. 1, such operation is reflected by first and second switches SW10 and SW20 of the selection unit 30 being switched to switching nodes N1 and N3, respectively. Referring back to FIG. 2, a selection control signal S2 may have a high level, and a selection control signal S1 may have a low level. Under this bias condition, write data may be transferred directly to the bit line BL and the source line SL from the data lines DL and DLB so as to be stored at a memory cell 10.

Alternatively, during a write operation, the transistors N3 and N5 may be turned on and the NMOS transistors N4 and N6 may be turned off. In the example of FIG. 1, such operation is reflected by the first and second switches SW10 and SW20 of the selection unit 30 be switched to switching nodes N2 and N4, respectively. Referring back to FIG. 2, the selection control signal S2 may have a low level, and the selection control signal S1 may have a high level. Under this bias condition, write data may be transferred with amplification by the bit line data latch unit 20. The bit line data latch unit 20 may generate a set bias voltage or a reset bias voltage in response to write data. In FIG. 2, there is illustrated a bit line sense amplifier as the bit line data latch unit 20. However, a bit line driver 22 may be installed to generate the set bias voltage or the reset bias voltage.

Figure 3:
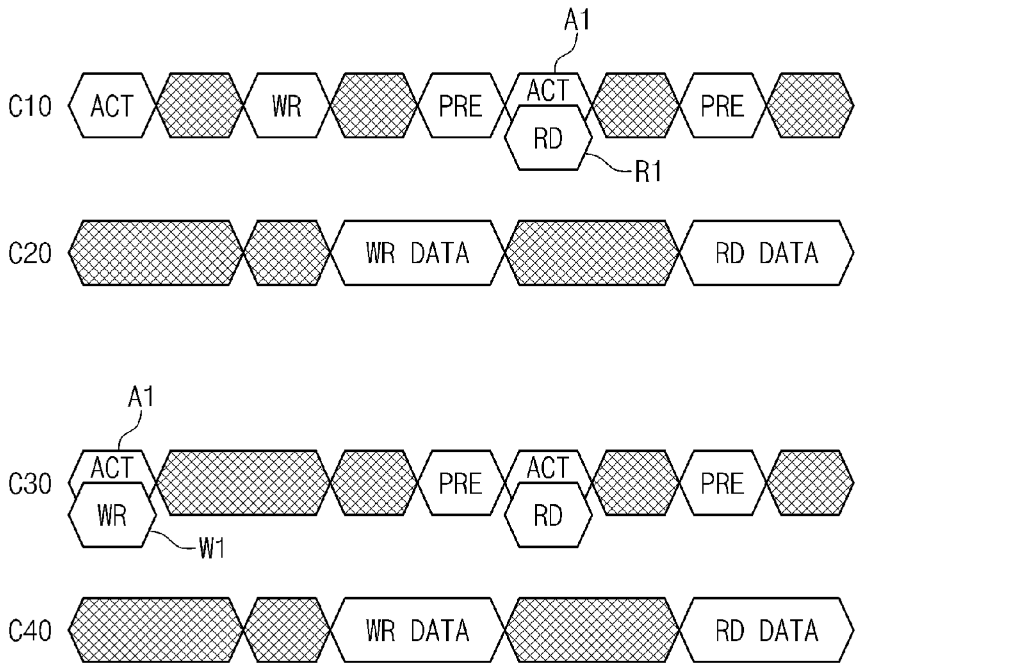
FIG. 3 is a timing diagram illustrating commands and data that may be applied to FIG. 1.

FIG. 3 is a timing diagram illustrating commands and data applied to FIG. 1.

Referring to FIG. 3, "C1" and "C2" may show timing when a bit line data latch unit 20 of FIG. 1 is used to secure a fast write operation. Referring to the timing C1, a delay interval may exist between an active command and a write command. Referring to the timing C2, if a write command is applied, write data may be written. Meanwhile, as understood from the timing C1, a delay interval may exist between an active command and a read command. If a read command is received, as illustrated by the timing C2, read data may be read after a predetermined delay. It is assumed that the bit line data latch unit 20 is used. In this case, if operations are performed according to timing C1 and C2, latency may be relatively slow, while a write operation is performed rapidly. Thus, a random write characteristic may be bettered.

Referring to FIG. 3, "C10" and "C20" may show timing when the bit line data latch unit 20 of FIG. 1 is not used at a read operation to secure fast latency. Referring to the timing C10, a delay interval may exist between an active command and a write command, while a delay interval may scarcely exist between an active command A1 and a read command R1. If the active command and the read command are applied nearly at the same time, referring to the timing C20, data may be read. It is assumed that the bit line data latch unit 20 is not used. In this case, if operations are performed according to timing C10 and C20, latency may be relatively fast at a read operation. Since the bit line data latch unit 20 is used at a write operation, a write operation may be performed rapidly.

Referring to FIG. 3, "C30" and "C40" may show timing when the bit line data latch unit 20 of FIG. 1 is not used at a read operation to secure fast latency and a fast write operation. Referring to the timing C30, a delay interval may scarcely exist between an active command A1 and a write command W1. Also, a delay interval may scarcely exist between an active command and a read command. Although the active command and the read command are applied nearly at the same time, referring to the timing C40, the bit line data latch unit 20 may be selectively used. That is, as the bit line data latch unit 20 is used at a write operation and is not used at a read operation, it is possible to achieve fast latency and a fast write operation. If operations are performed according to timing C30 and C40, latency may be bettered at a read operation, and a write time of operation may be reduced at a write operation.

Figure 4:
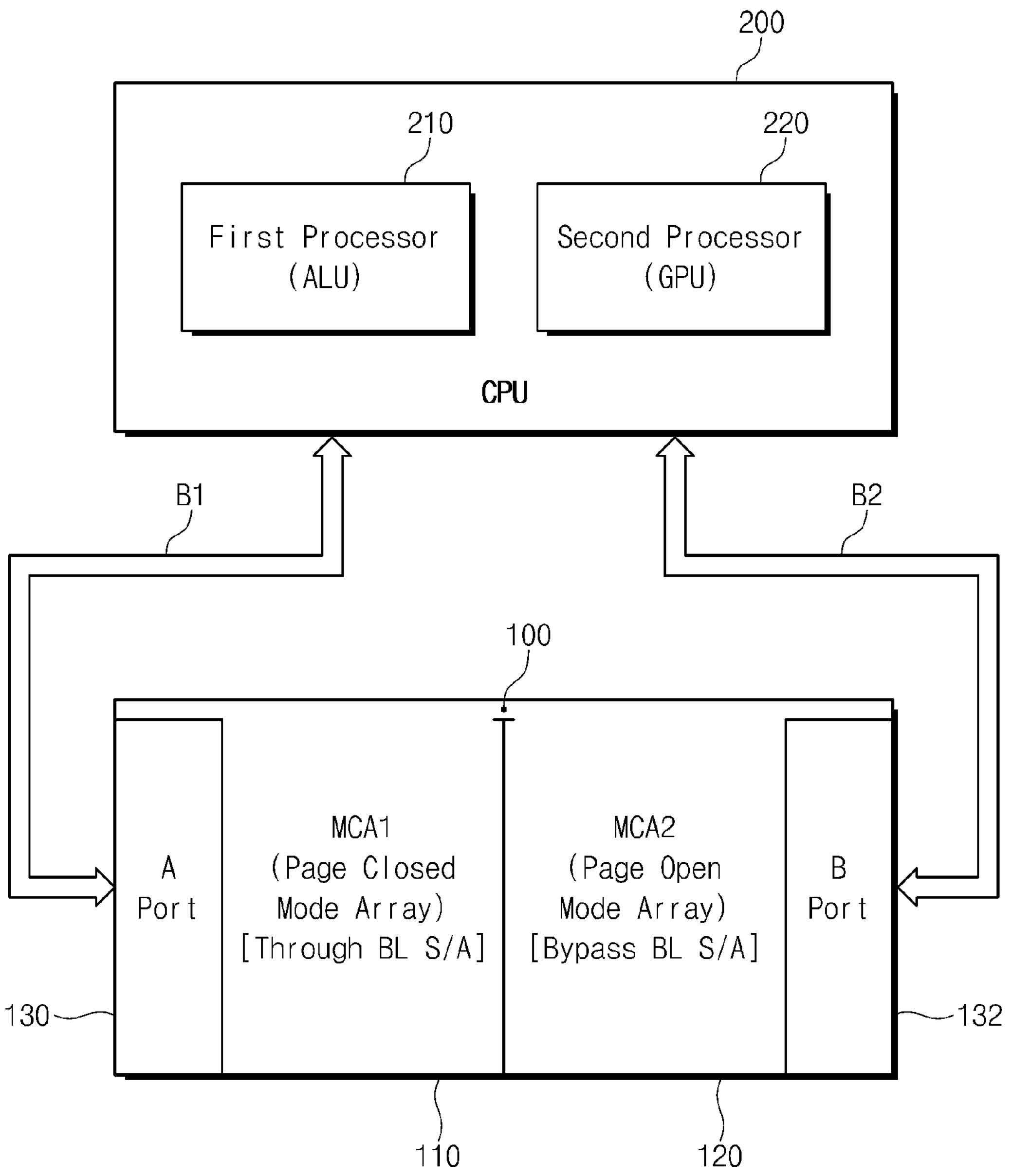
FIG. 4 is a block diagram schematically illustrating a data processing system that may include the semiconductor memory device of FIG. 1.

FIG. 4 is a block diagram schematically illustrating a data processing system including a semiconductor memory device of FIG. 1.

Referring to FIG. 4, a data processing system may include a processor unit 200 having a bus for data processing and a semiconductor memory device 100.

The processor unit 200 may be a multi-processor including a first processor 210 and a second processor 220.

The first processor 210 may be an ALU processor for arithmetic operations, and the second processor 220 may be a GPU processor for graphic processing.

If the semiconductor memory device 100 has multiple ports, a first bus B1 may be connected between the first processor 210 and an A port 130 of the semiconductor memory device 100. Also, a second bus B2 may be connected between the second processor 210 and a B port 132 of the semiconductor memory device 100.

The semiconductor memory device 100 may include two memory cell groups, for example. That is, a memory cell array formed of MRAM cells may include a first memory cell array group 110 and a second memory cell array group 120.

The first memory cell array group 110 may be a group which uses a bit line data latch unit 20 at a data access operation. In this case, the first memory cell array group 110 may be referred to a page close mode array.

The second memory cell array group 120 may be a group which does not use the bit line data latch unit 20 at a data access operation. In this case, the second memory cell array group 120 may be referred to a page open mode array.

The performance of the data processing system may be improved by matching the first and second memory cell array groups 110 and 120 to be suitable for data processing characteristics of the first and second processors 210 and 220 of the processor unit 200.

The semiconductor memory device 100 may include constituent elements of FIG. 1, that is, a bit line data latch unit 20 configured to sense-amplify data stored at a memory cell connected with a bit line or to store write data at the memory cell through a bit line; an input/output driver 40 configured to output read data of the bit line to a bus or to drive write data provided from the bus; and a selection unit 30 configured to select whether the read data and the write data are transferred through the bit line data latch unit. In some cases, the selection unit 30 may be removed, and the bit line data latch unit 20 may be removed from the second memory cell array group 120.

The semiconductor memory device 100 may be accessed by the first and second processors through the A and B ports 130 and 132. The memory cell array may include a shared area which is accessed in common by the first and second processors. Also, the memory cell array may include dedicated memory areas. For example, a first dedicated memory area may be connected with the A port 130, and a second dedicated memory area may be connected with the B port 132.

Figure 5:
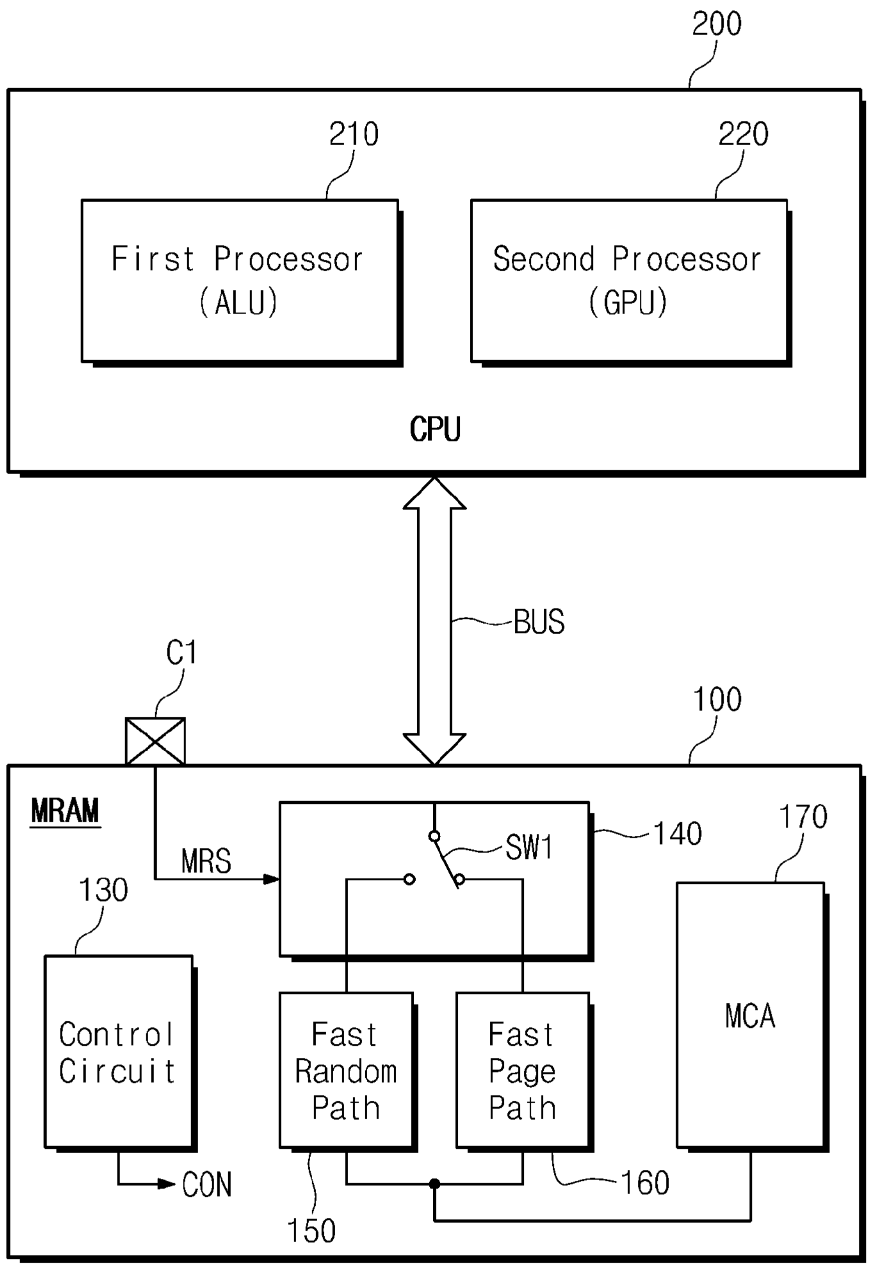
FIG. 5 is a block diagram schematically illustrating another data processing system that may include the semiconductor memory device of FIG. 1.

FIG. 5 is a block diagram schematically illustrating another data processing system including a semiconductor memory device of FIG. 1.

Unlike FIG. 4, a semiconductor memory device of FIG. 5 may have a single port connected with a bus.

Referring to FIG. 5, a data processing system may include a processor unit 200 having a bus for data processing and a semiconductor memory device 100.

The processor unit 200 may be a multi-processor including a first processor 210 and a second processor 220.

The first processor 210 may be an ALU processor for arithmetic operations, and the second processor 220 may be a GPU processor for graphic processing.

In the event that the semiconductor memory device 100 has one port, the bus may be connected in common with the first and second processors 210 and 220.

The semiconductor memory device 100 may include two types of data paths, for example. That is, the bus may be connected with a memory cell array 170 formed of MRAM cell through one of a fast random path 150 and a fast page path 160.

Herein, the fast random path 150 may be a path where a bit line data latch unit is used, and the fast page path 160 may be a path where the bit line data latch unit is not used.

A selection circuit 140 may connect a switch SW1 with one of the fast random path 150 and the fast page path 160 in response to an MRS signal applied through a pad C1.

A control circuit 130 may be controlled by the processor unit 200, and may control an operation of each circuit block in the semiconductor memory device 100. For this, the control circuit 130 may generate a control signal CON.

The performance of the data processing system may be improved by selecting one of the fast random path 150 and the fast page path 160 to be suitable for data processing characteristics of the first and second processors 210 and 220 of the processor unit 200.

The semiconductor memory device 100 may include constituent elements of FIG. 1, that is, a bit line data latch unit 20 configured to sense-amplify data stored at a memory cell connected with a bit line or to store write data at the memory cell through a bit line; and an input/output driver 40 configured to output read data of the bit line to a bus or to drive write data provided from the bus.

Figure 6:
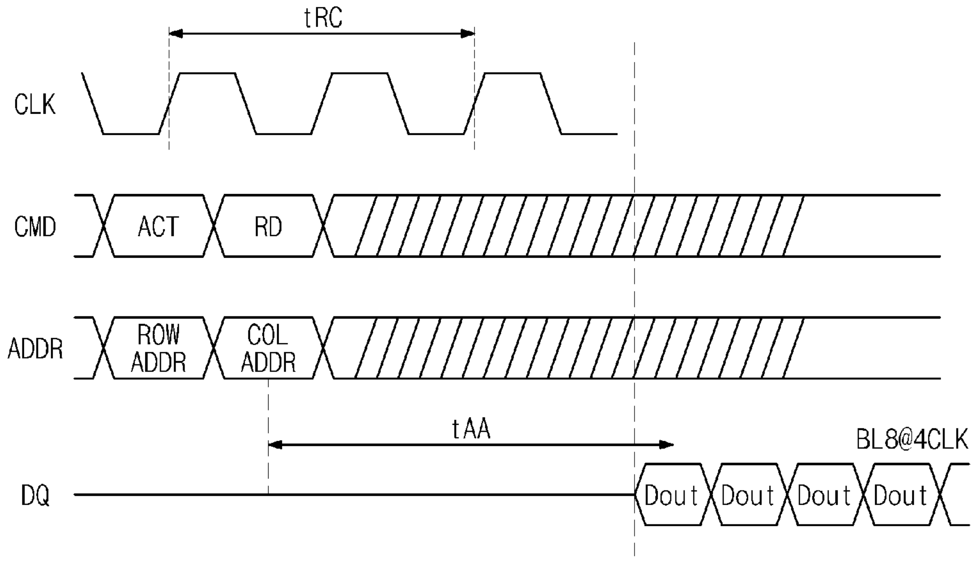
FIG. 6 is an exemplary timing diagram of the semiconductor memory device of FIG. 4 or 5.

FIG. 6 is a timing diagram of a semiconductor memory device of FIG. 4 or 5.

Referring to FIG. 6, there is illustrated an example in which an active command ACT and a read command RD are applied within a period of time corresponding to one clock cycle to improve latency at a read operation. Thus, in the event that the active command ACT and the read command RD are applied within a period of time corresponding to one clock cycle, an interval tAA indicating a latency time may be shortened. In this case, a bit line data latch unit 20 may not be used to improve the latency.

Figure 7:
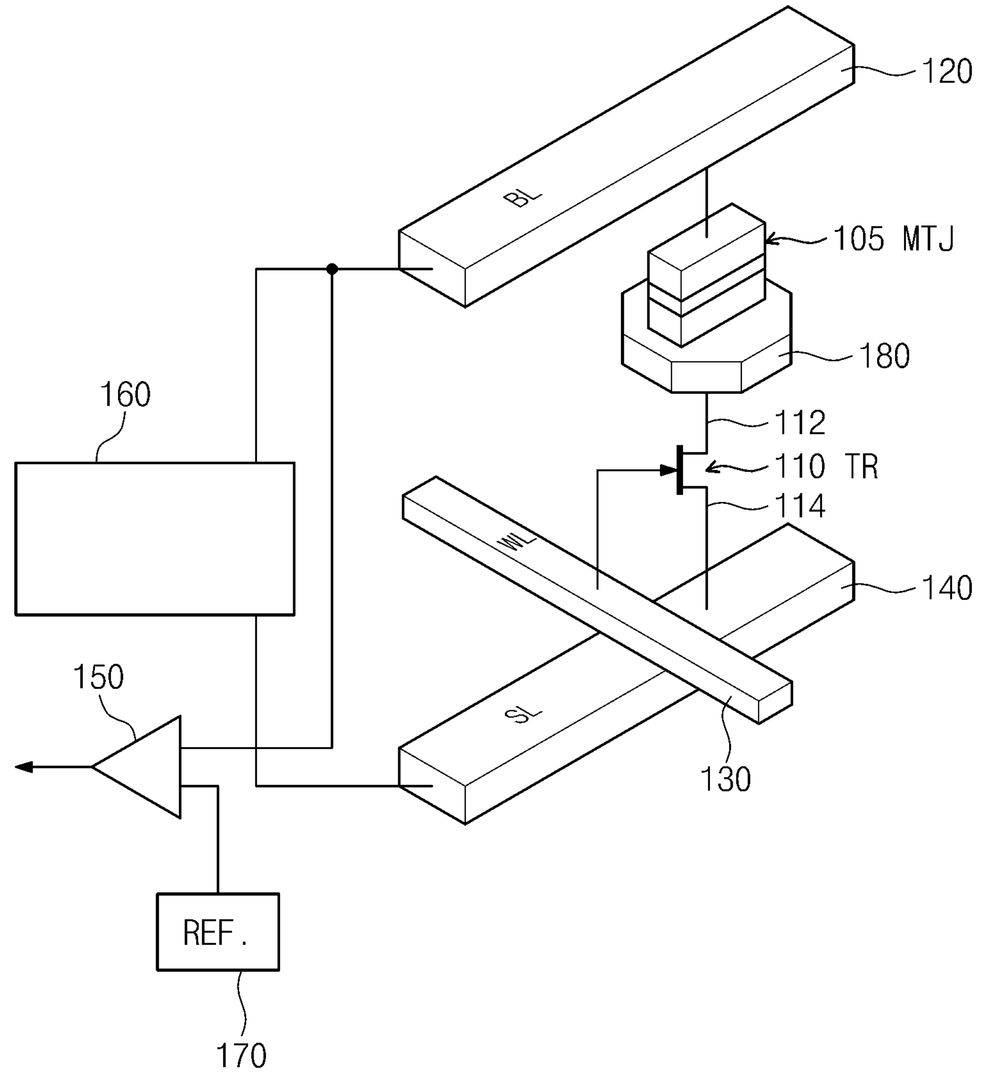
FIG. 7 is a diagram illustrating an operating principle of a memory cell.

FIG. 7 is a diagram illustrating an operating principle of a memory cell applied to the inventive concept.

Referring to FIG. 7, an STT-MRAM cell may include a magnetic tunnel junction (MTJ) storage element 105, a transistor 110, a bit line 120, and a word line 130. For example, the MTJ storage element 105 may be formed of a pinned layer and a free layer separated by an insulation (tunnel barrier) layer and each having a magnetic field. A source line 140 may be connected with the transistor 110 through a line 114.

A sense amplifier 150 may compare a signal level of a bit line reference 170 and a signal level of a bit line 120 to amplify a comparison result (i.e., a difference between signal levels). A read/write circuit 160 may be connected between the bit line 120 and the source line 140.

The MTJ storage element 105 may be grown on a metal layer known as a bottom electrode (BE) plate 180, and the bottom electrode plate 180 may be connected to an upper portion 112 of the transistor 110. Mechanical surface characteristics (e.g., flatness or roughness) of the bottom electrode plate 180 may influence the performance of the MTJ storage element 105. The bottom electrode plate 180 may be formed of stiff polished metal, for example, a titanium alloy having mechanical characteristics suitable to form it on the MTJ storage element 105 or metal similar thereto.

The MRAM may be a memory using such a characteristic that a spin is divided into spin-up and spin-down. The MRAM may be a nonvolatile memory technique using magnetic characteristics. For example, the STT-MRAM may use electron spin (or electron polarization) when the electrons penetrate a thin film (e.g., a spin filter). Also, the STT-MRAM may comprise an STT-RAM, a spin momentum transfer RAM (SMT-RAM), and a spin transfer torque magnetisation switching RAM (Spin-RAM).

A typical MRAM using a magneto-resistance effect for changing resistance of a conductive material using a magnetic field may include a plurality of resistance memory cells formed by MTJ (Magnetic Tunnel Junction).

A tunneling current (or, tunneling resistance) flowing through the MTJ may vary according to a magnetization state of a ferromagnetic material. The ferromagnetic material may include a free layer and a pinned layer with the MTJ interposed therebetween. The tunneling resistance may be low when magnetization directions of the free and pinned layers are parallel and high when magnetization directions of the free and pinned layers are anti-parallel. In the event that an anti-ferromagnetic layer called a pinning layer is added to the pinned layer, a magnetization direction of the pinned layer may be fixed and the tunneling resistance may vary according to a magnetization direction of the free layer. Herein, the magnetization direction of the free layer may be switched using a magnetic field formed by currents flowing along a bit line and a word line. In the above-described method, as a resistive memory device is highly integrated, coercivity of the free layer may increase. To reduce unwanted switching of the free layer, a magnetic memory device using a spin transfer torque process or a magnetic memory device using a toggle switching writing process may be preferred.

The magnetic memory device using a spin transfer torque manner may switch a free layer in a required direction using a spin transfer of electron by providing a current in a direction where a spin is polarized. This may mean that the amount of current required is relatively reduced according to scale-down of a cell size. Thus, it is possible to highly integrate the resistive memory device.

A word line and a bit line may be disposed to be inclined by a 40° direction at an intersection, and MTJ may include a second magnetic area, a tunneling barrier, and a first magnetic area which are sequentially stacked. Herein, the first and second magnetic areas may include an SAF (Synthetic Anti-Ferromagnetic) structure which includes an upper ferromagnetic layer, a lower ferromagnetic layer, and a diamagnetic coupling spacer layer inserted between the upper ferromagnetic layer and the lower ferromagnetic layer.

Figure 8:
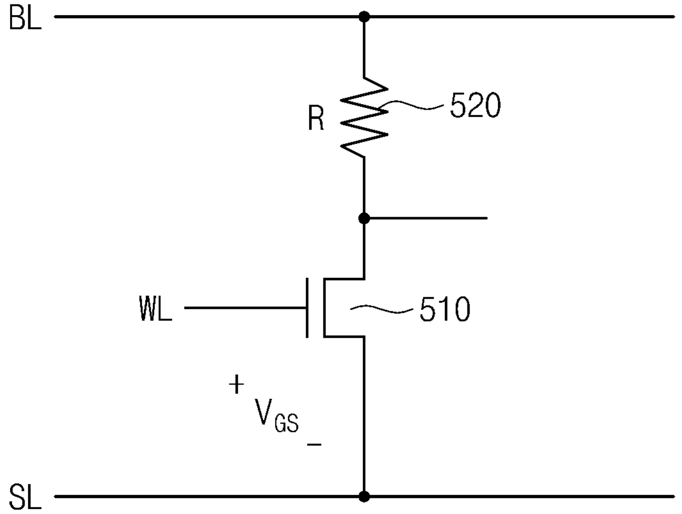
FIG. 8 is an equivalent circuit diagram of the memory cell of FIG. 7.

FIG. 8 is an equivalent circuit diagram of a memory cell of FIG. 7.

Referring to FIG. 8, an STT-MRAM cell may include a word line WL connected with an access transistor 510. A storage element (e.g., MTJ) 520 may be expressed by a resistor. The access transistor 510 and the storage element 520 may be disposed between a bit line BL and a source line SL. During a writing operation, a state "0" may be stored under the condition that WL=H, BL=H, and SL=L, and a state "1" may be stored under the condition that WL=H, BL=L, and SL=L. In example embodiments, "H" may be a high voltage/logic level, and "L" may be a low voltage/logic level. Voltage levels may be supply voltage levels (e.g., Vdd and 0V) or higher or lower than the supply voltage levels. Arrangement and state conditions may be exemplary. However, the inventive concept is not limited thereto.

Figure 9:
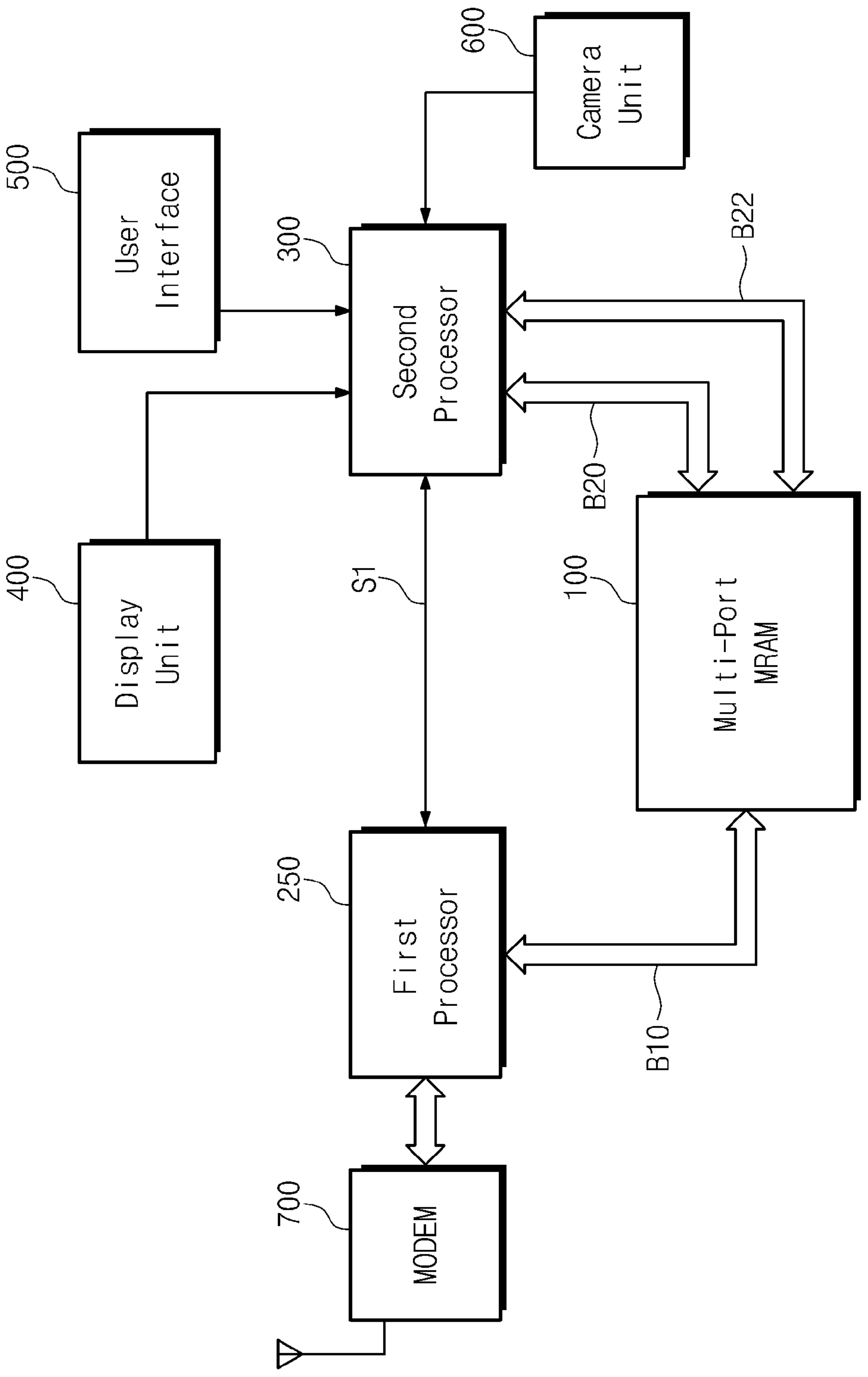
FIG. 9 is a block diagram schematically illustrating an exemplary mobile device.

FIG. 9 is a block diagram schematically illustrating an example a mobile device.

Referring to FIG. 9, a mobile device may include a multi-port MRAM 100, a first processor 250, a second processor 300, a display unit 400, a user interface 500, a camera unit 600, and a modem 700.

The multi-port MRAM 100 may have three ports respectively connected with first to third buses B10, B20, and B22, and may be connected with the first and second processors 250 and 300. The first port of the multi-port MRAM 100 may be connected with the first processor 250 (e.g., a baseband processor) through the first bus B10. The second port of the multi-port MRAM 100 may be connected with the second processor 300 (e.g., an application processor) through the second bus B20. The third port of the multi-port MRAM 100 may be connected with the second processor 300 through the third bus B22.

One multi-port MRAM 100 may replace one storage memory and two DRAMs.

The multi-port MRAM 100 of FIG. 9 may include three ports to perform roles of a DRAM and a flash memory. In this case, since the multi-port MRAM 100 may have a data path option function, a delay between an active command and a command at a memory may be selectively reduced. Thus, selection may be made according to the case that latency is important and the case that a fast write time of operation is required. Therefore, a latency time may be shortened when the latency is selected. A decrease in the latency time may improve high-speed responsibility of the mobile device. Also, since a memory device is used as two DRAMs and a flash memory, a system size may be scaled down, so that a cost necessary to implement the system is reduced. In addition, since it is used without changing interconnection between existing processors, the compatibility may be improved.

An interface of the first bus B10 may be a volatile memory interface, and the first port may receive first packet data DQ1/ADDR1/CMD1 generated from the first processor 250 to transfer it to an internal circuit block of the multi-port MRAM 100. Also, the first port may provide first data of the multi-port MRAM 100 to the first processor 250. In this case, the first data may be sent and received in parallel.

An interface of the third bus B22 may be a volatile memory interface, and the third port may receive third packet data DQ3/ADDR3/CMD3 generated from the second processor 300 to transfer it to an internal circuit block of the multi-port MRAM 100. Also, the third port may provide third data of the multi-port MRAM 100 to the second processor 300.

In this case, the first and third data may be serial data or parallel data, sent and/or received serially or in parallel, respectively. A clock generator (not shown) may generate a first internal clock signal ICLK1 and a third internal clock signal ICLK3 based on an external clock signal CLK. In this case, a frequency of the first internal clock signal ICLK1 may be different from that of the third internal clock signal ICLK3.

Meanwhile, an interface of the second bus B20 may be a nonvolatile memory (e.g., NAND flash) interface, and the second port may receive second packet data DQ2/ADDR2/CMD2 generated from the second processor 300 to transfer it to an internal circuit block of the multi-port MRAM 100. Also, the second port may provide second data of the multi-port MRAM 100 to the second processor 300. In this case, the second data may be serial data or parallel data.

In some cases, the first and second processors 200 and 300 and the MRAM 100 may be integrated within a chip or they may be integrated within a package. In this case, the MRAM 100 may be embedded in the mobile device.

In the event that the mobile device is a handheld communications device, the first processor 250 may be connected with the modem 700 which transmits and receives communications data and modulates and demodulates data.

A NOR or NAND flash memory may be additionally connected to the first processor 250 or the second processor 300 to store mass storage information.

The display unit 400 may have a liquid crystal having a backlight, a liquid crystal having an LED light source, or a touch screen (e.g., OLED). The display unit 400 may be an output device for displaying images (e.g., characters, numbers, pictures, etc.) in color.

There is described an example in which the mobile device is a mobile communications device. In some cases, the mobile device may be used as a smart card by adding or removing components.

The mobile device may be connected with an external communications device through a separate interface. The communications device may be a DVD player, a computer, a set top box (STB), a game machine, a digital camcorder, or the like.

The camera unit 600 may include a camera image processor (CIS), and may be connected with the second processor 300.

Although not shown in FIG. 9, the mobile device may further include an application chipset, a camera image processor (CIS), a mobile DRAM, and so on.

An MRAM chip or a flash memory chip may be mounted independently or using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

In FIG. 9, there is illustrated an example in which an MRAM is installed as part of the mobile device. However, a variety of nonvolatile memories may be used instead of the MRAM.

The nonvolatile memory may store various types of data information such as texts, graphics, software codes, and so on.

The nonvolatile memory device may be EEPROM (Electrically Erasable Programmable Read-Only Memory), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

A semiconductor memory device 100 of FIG. 1 may be used as a memory which replaces a DRAM and a small-capacity flash memory in a cellular phone, a tablet PC, or a notebook computer.

Figure 10:
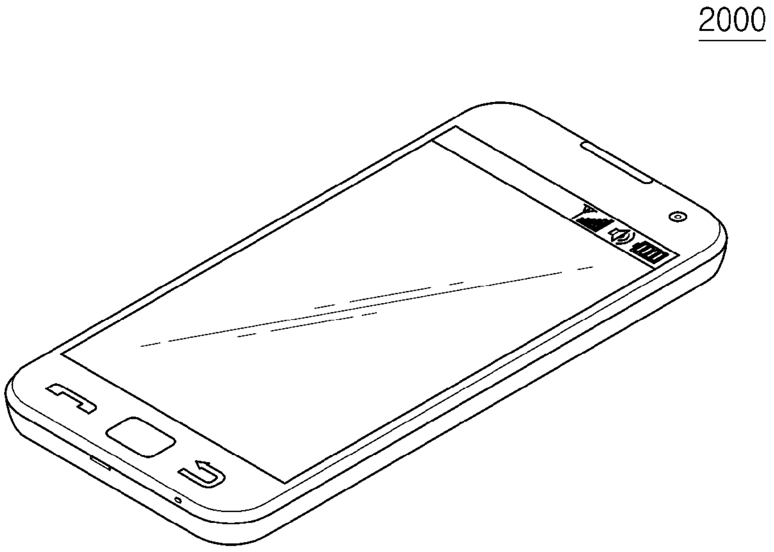
FIG. 10 is a diagram illustrating an exemplary cellular phone.

FIG. 10 is a diagram illustrating an exemplary cellular phone.

Referring to FIG. 10, a cellular phone 2000 may include a semiconductor memory device 100 of FIG. 1, so that a DRAM and a small-capacity flash memory may be unnecessary. Thus, one of fast latency and fast write may be selectively used. A decrease in the latency time may improve high-speed responsibility of the cellular phone. Also, since a memory device is used as two DRAMs and a flash memory, a phone size may be scaled down, so that a cost necessary to implement the cellular phone is reduced.

Figure 11:
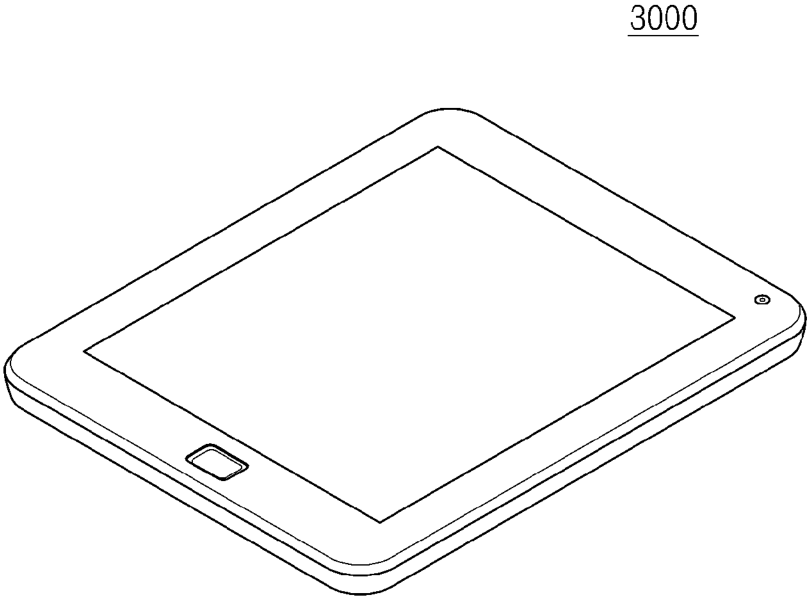
FIG. 11 is a diagram illustrating an exemplary tablet PC.

FIG. 11 is a diagram illustrating an exemplary tablet PC.

Referring to FIG. 11, a tablet PC 3000 may include a semiconductor memory device 100 of FIG. 1, so that a DRAM and a small-capacity flash memory may be unnecessary. Thus, one of fast latency and fast write may be selectively used. A decrease in the latency time may improve high-speed responsibility of the tablet PC. Also, since a memory device is used as two DRAMs and a flash memory, a PC size may be scaled down, so that a cost necessary to implement the tablet PC is reduced.

Figure 12:
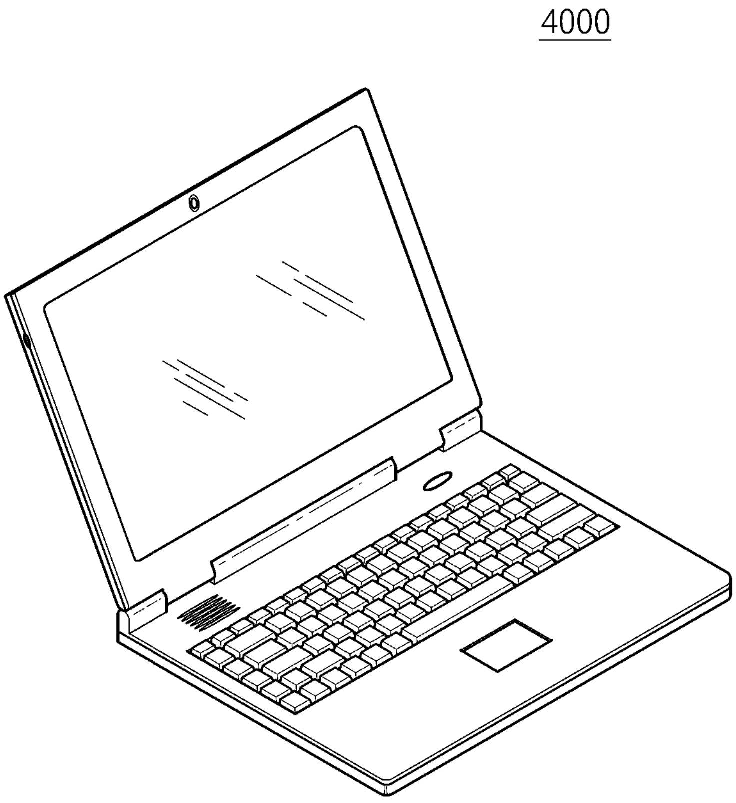
FIG. 12 is a diagram illustrating an exemplary notebook computer.

FIG. 12 is a diagram illustrating an application of the inventive concept applied to a notebook computer.

Referring to FIG. 12, a notebook computer 4000 may include a semiconductor memory device 100 of FIG. 1, so that a DRAM and a small-capacity flash memory are removed. Thus, one of fast latency and fast write may be selectively used. A decrease in the latency time may improve high-speed responsibility of the notebook computer. Also, since a memory device is used as two DRAMs and a flash memory, a size of the notebook computer may be scaled down, so that a cost necessary to implement the notebook computer is reduced.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative. For example, various changes and modifications on a manner of implementing switching of data paths may be made without departing from the spirit and scope of the present invention.

What is claimed is:

1. A semiconductor memory device comprising:

a memory cell;

a bit line connected to the memory cell;

a bit line data latch configured to sense-amplify read data stored in the memory cell connected with the bit line and to store write data to be written in the memory cell through the bit line;

an input/output driver configured to output the read data on the bit line to an external device and to drive the write data provided from the external device; and a selection circuit configured to select whether the bit line data latch is bypassed or is used or bypassed to sense-amplify read data stored in the memory cell and to store the write data to be written in the memory cell, wherein the memory cell is a spin transfer torque magnetoresistive random access memory type of memory (STT-MRAM) cell, and wherein the bit line data latch comprises a bit line sense amplifier configured to compare a signal level of the bit line and a reference level of a source line to amplify a comparison result.

2. The semiconductor memory device of claim 1, wherein the selection circuit is configured to select whether data stored in the memory cell is transferred directly to the input/output driver or to the input/output driver via the bit line data latch at a read operation, and to select whether the write data is transferred directly to the memory cell or to the memory cell via the bit line data latch at a write operation.

3. The semiconductor memory device of claim 1, wherein the input/output driver comprises:

an input/output amplifier configured to amplify the read data on an input/output line; and a write driver configured to drive the input/output line with the write data.

4. The semiconductor memory device of claim 1, wherein the selection circuit is a multiplexer configured to selectively connect either the input/output driver or the bit line data latch to the memory cell, in response to a signal input to the multiplexer.

5. The semiconductor memory device of claim 4, wherein the signal input to the multiplexer is a mode register set signal.

6. The semiconductor memory device of claim 1, further comprising a control circuit configured to control a read operation in response to an active command and a read command received from a source external to the memory device within one clock cycle.

7. A data processing system comprising:

a processor unit configured to execute data processing; and a semiconductor memory device connected to the processor unit including:

a memory cell;

a bit line connected to the memory cell;

a bit line data amplifier configured to sense-amplify data stored in the memory cell connected to the bit line and to store write data in the memory cell through the bit line;

an input/output driver configured to output read data on the bit line to a bus or to drive write data provided from the bus; and a selection circuit configured in a first mode to communicate the read data and the write data between the memory cell and the input/output driver using the bit line data amplifier and configured in a second mode to communicate the read data and the write data between the memory cell and the input/output driver without using the bit line data amplifier, wherein the selection circuit is configured in a third mode to connect the memory cell via the bit line data amplifier to the input/output driver during a write operation and to connect the memory cell directly to the input/output driver so that the read data bypasses the bit line data amplifier during a read operation, and wherein the processor unit is configured to apply an active command and a read command to the semiconductor memory device at a period of time corresponding to one clock cycle of the read operation.

8. The data processing system of claim 7, wherein the selection circuit is configured in a fourth mode to connect the memory cell directly to the input/output driver so that the write data bypasses the bit line data amplifier during a write operation and to connect the memory cell via the bit line data amplifier to the input/output driver during a read operation.

9. The data processing system of claim 8, wherein the processor unit is configured to apply an active command and a write command to the semiconductor memory device at a period of time corresponding to one clock cycle of the read operation.

10. The data processing system of claim 7, wherein the processor unit comprises a plurality of processors and the semiconductor memory device is a multi-port MRAM.

11. A memory device comprising:

a memory cell;

a bit line connected to the memory cell;

a bit line data amplifier;

an input/output driver; and a selection circuit, the selection circuit being operable in a first mode to configure a first data path between the input/output driver and the memory cell and in a second mode to configure a second data path between the input/output driver and the memory cell, wherein in the first mode the bit line data amplifier is configured to amplify data transmitted between the input/output driver and the memory cell and in the second mode the bit line data amplifier is not configured to amplify data transmitted between the input/output driver and the memory cell, and wherein the selection circuit is configured to disconnect the bit line data amplifier from the memory cell in the second mode.

12. The memory device of claim 11, further comprising a mode register set providing a mode selection signal to the selection circuit, the mode selection signal identifying one of the first mode or the second mode.

13. The memory device of claim 12, further comprising a processor connected to the input/output driver to provide write data to the input/output driver, to receive read data from the input/output driver and to provide the mode selection signal to the memory device.

14. The memory device of claim 11, wherein the memory device comprises a multi-port memory and first and second processors connected to the multi-port memory, wherein a first part of the multi-port memory is dedicated to the first processor and a second part of the multi-port memory is dedicated to the second processor.

* * * * *